(12) United States Patent
Shiota (10) Patent No.: US 8,252,488 B2
(45) Date of Patent: Aug. 28, 2012

(54) MASK BLANK SUBSTRATE MANUFACTURING METHOD, AND REFLECTIVE MASK BLANK MANUFACTURING METHOD

(75) Inventor: Yuki Shiota, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 261 days.

(21) Appl. No.: 12/604,991

(22) Filed: Oct. 23, 2009

(65) Prior Publication Data

US 2010/0104955 A1    Apr. 29, 2010

(30) Foreign Application Priority Data

Oct. 23, 2008  (JP) ................................ 2008-273516
Sep. 19, 2009  (JP) ................................ 2009-218199

(51) Int. Cl.
*G03F 1/00*    (2012.01)

(52) U.S. Cl. ...................... 430/5; 134/1; 65/60.1; 65/61

(58) Field of Classification Search .......... 430/5; 134/1; 451/36, 41; 65/60.1, 61
See application file for complete search history.

(56) References Cited

U.S. PATENT DOCUMENTS

| | | | |
|---|---|---|---|
| 6,440,531 B1* | 8/2002 | Kurachi et al. | 428/141 |
| 2004/0192063 A1* | 9/2004 | Koike | 438/736 |
| 2008/0092918 A1* | 4/2008 | Ikuta | 134/1 |
| 2008/0311487 A1* | 12/2008 | Ito et al. | 430/5 |

FOREIGN PATENT DOCUMENTS

| | | |
|---|---|---|
| JP | 64-040267 A | 2/1989 |
| JP | 2002-122981 A | 4/2002 |
| JP | 3879828 A | 7/2003 |

* cited by examiner

*Primary Examiner* — Mark F Huff
*Assistant Examiner* — Stewart Fraser
(74) *Attorney, Agent, or Firm* — Sughrue Mion, PLLC (57) ABSTRACT

Provided is a mask blank substrate manufacturing method in which a low thermal expansion glass substrate containing titanium (Ti) oxide is polished using a polishing agent, then treated using an aqueous solution containing hydrofluoric acid, then cleaned using an acidic solution with a pH of 4 or less, and then further cleaned using an alkaline solution.

9 Claims, 2 Drawing Sheets

MASK BLANK SUBSTRATE MANUFACTURING METHOD, AND REFLECTIVE MASK BLANK MANUFACTURING METHOD

This application is based upon and claims the benefit of priority from Japanese Patent Application No. 2008-273516, filed on Oct. 23, 2008, and Japanese Patent Application No. 2009-218199, filed on Sep. 19, 2009, the disclosures of which are incorporated herein in their entirety by reference.

TECHNICAL FIELD

This invention relates to a method of manufacturing a substrate for a mask blank serving as a base for manufacturing an exposure mask for use in the manufacture of semiconductor devices or the like (hereinafter a substrate for a mask blank will be referred to as a "mask blank substrate") and further relates to a method of manufacturing a reflective mask blank using such a mask blank substrate.

BACKGROUND ART

With the increase in density and accuracy of ultra-LSI devices in recent years, the requirement to flatness and surface defect of mask blank glass substrates is becoming stricter year by year. As a conventional precision polishing method for reducing the surface roughness of a mask blank glass substrate, there is one disclosed in JP-A-S64-40267 (Patent Document 1), wherein surfaces of a mask blank glass substrate are polished using a polishing agent mainly composed of cerium oxide and then are finish-polished using colloidal silica.

Then, the polished glass substrate is cleaned, thereby removing foreign matter such as the polishing agent adhering/remaining on the substrate surfaces. As a conventional substrate cleaning method, there is one disclosed in JP-B-3879828 (Patent Document 2), wherein a substrate is treated with a low-concentration hydrofluoric acid aqueous solution, then cleaned with an alkaline solution, and finally washed with water (rinsed).

The mask blank glass substrate is manufactured in this manner and then a light shielding film or a phase shift film and so on are formed on the upper surface of the obtained glass substrate, thereby obtaining a photomask blank.

In recent years, following the demand for further miniaturization of semiconductor devices, the extreme ultraviolet (EUV) lithography being an exposure technique using EUV light has been expected to be promising. The EUV light represents light in a wavelength band of the soft X-ray region or the vacuum ultraviolet region and, specifically, light having a wavelength of about 0.2 to 100 nm. As a mask for use in the EUV lithography, there is proposed an exposure reflective mask described in JP-A-2002-122981 (Patent Document 3).

The proposed reflective mask has a multilayer reflective film formed on a substrate and adapted to reflect exposure light and further has an absorbent film formed in a pattern on the multilayer reflective film and adapted to absorb the exposure light. The exposure light incident on the reflective mask disposed in an exposure apparatus (pattern transfer apparatus) is absorbed at a portion where the absorbent film is present, while, is reflected by the multilayer reflective film at a portion where the absorbent film is not present so that a reflected optical image is transferred onto a semiconductor substrate through a reflective optical system.

In the case of such an EUV reflective mask blank substrate, the requirement to its surface defect is extremely strict. That is, when a reflective mask blank and a reflective mask are fabricated using a glass substrate having on its surface a convex defect due to adhesion of foreign matter or the like, if the convex defect exists near a mask pattern, reflected light of exposure light is subjected to a change in phase due to the convex defect. This change in phase causes degradation of position accuracy or contrast of a transferred pattern. Particularly when short-wavelength light such as EUV light is used as exposure light, the change in phase becomes very sensitive to minute irregularities on a surface of the mask and thus the influence thereof on a transferred image increases, and therefore, the change in phase caused by the minute irregularities is an unignorable problem. In fact, when EUV light having a wavelength of, for example, about 13 nm is used as exposure light, even a convex defect of about 2 nm can cause a phase defect. In the case of the EUV reflective mask blank, since a film formed by, for example, alternately laminating Mo and Si layers, each having a thickness of several nm, by about 40 to 60 cycles is used as the above-mentioned multilayer reflective film on the substrate, even if there is a minute convex defect of a degree that causes no particular problem on a surface of the substrate, it may happen that when the multilayer reflective film is formed, the size of the defect on the substrate surface increases to generate a convex defect large enough to cause a phase defect on a surface of the multilayer reflective film.

For the reason described above, particularly in the case of the EUV reflective mask blank substrate, it is necessary to satisfy the condition of very high level for the surface defect.

SUMMARY OF THE INVENTION

The above-mentioned reflective mask blank glass substrate is also manufactured by surface polishing using a polishing agent and then cleaning. As the reflective mask blank glass substrate, it is preferable to use a substrate having high smoothness and high flatness in order to obtain high reflectance and high transfer accuracy and it is preferable to use a substrate having a low thermal expansion coefficient in order to prevent pattern deformation due to heat in exposure. In view of this, in the case of, for example, an amorphous glass, use is often made of a $SiO_2$—$TiO_2$-based glass obtained by adding about 6 wt % $TiO_2$ to $SiO_2$. According to the study by the present inventors, however, it has been found that, in the case of a synthetic quartz substrate used as a general photomask substrate, it can be finished to an excellent defect quality level when it is polished and then cleaned using the above-mentioned conventional cleaning method, while, in the case of the above-mentioned reflective mask blank substrate, convex defects are generated in large numbers on the surfaces of the substrate when it is polished and then cleaned using the above-mentioned conventional cleaning method in the same manner. That is, it has been found that, even by applying the conventional cleaning method to the low thermal expansion glass substrate for the reflective mask blank, it cannot be finished to a level satisfying defect quality of very high level required for the EUV reflective mask blank substrate.

It is therefore an object of this invention to provide a method of manufacturing a high-quality mask blank substrate in which the number of convex defects is reduced to satisfy the requirement for high-level defect quality.

It is another object of this invention to provide a method of manufacturing a mask blank substrate suitable as a reflective mask blank substrate required to have defect quality of very high level.

It is still another object of this invention to provide a method of manufacturing a reflective mask blank using such a mask blank substrate.

In the case of a synthetic quartz substrate used as a general photomask substrate, it can be finished to an excellent defect quality level when it is polished and then cleaned using the conventional cleaning method. On the other hand, in the case of a $SiO_2$—$TiO_2$-based low thermal expansion glass substrate used as a reflective mask blank substrate, convex defects are generated in large numbers on surfaces of the substrate when it is polished and then cleaned using the conventional cleaning method in the same manner. As a result of studying its reason, the present inventors have conjectured as follows.

As a result of analyzing the convex defects detected on the low thermal expansion glass substrate after the cleaning, the present inventors have obtained knowledge that since Ti being a substrate component was detected, there were those convex defects generated by dissolution of the substrate itself. It is considered that when a glass substrate after polishing is treated with a hydrofluoric acid aqueous solution, a substrate component is dissolved by a glass etching action due to hydrofluoric acid, then, when alkaline cleaning is carried out, the condensation reaction between the dissolved substrate component and another dissolved substrate component or surfaces of the substrate is promoted in an alkaline environment so that reaction products are redeposited on the substrate surfaces (in a form involving a polishing slurry depending on a case), thereby forming convex defects. That is, it is considered that, according to the conventional processes of hydrofluoric acid treatment and then alkaline cleaning, the dissolution and redeposition of the substrate component are promoted to increase the generation of convex defects. The reason that the convex defects are generated in large numbers on the substrate surfaces particularly when the $SiO_2$—$TiO_2$-based low thermal expansion glass substrate is cleaned using the conventional cleaning method is considered as follows. That is, $Si^{4+}$ in a glass structure is in a stable state with saturated coordination when it is four-coordinated, while, $Ti^{4+}$ in a low thermal expansion glass structure is in an unsaturated coordination state when it is four-coordinated (stable coordination number is six), and thus $Ti^{4+}$ is more susceptible to nucleophilic attack by hydrofluoric acid than $Si^{4+}$ on substrate surfaces so as to be etched. By the etching of the glass substrate with the hydrofluoric acid, both ≡Ti—OH group and ≡Si—OH group are produced. Generally, the acid-dissociation equilibrium of ≡M—OH group is given by an acid-dissociation equilibrium constant Ka, wherein Ka=[≡M—O—][H+]/[≡M—OH] (M: Ti, Si, ... ). Further, pKa=−log 10 Ka and the condensation reaction rate becomes large when pKa≈pH. The ≡Ti—OH group has a larger acid-dissociation equilibrium constant pKa than the ≡Si—OH group and thus the condensation reaction thereof tends to occur on the alkaline side. To sum up, in the case of the low thermal expansion glass substrate including the Ti component therein, the dissolution and redeposition of the substrate component are promoted as compared with the synthetic quartz substrate, thereby increasing the generation of convex defects.

This invention has been completed as a result of further conducting intensive studies based on the elucidated fact and consideration described above.

According to an aspect of the present invention, there is provided a method of manufacturing a mask blank substrate, comprising preparing a low thermal expansion glass substrate containing titanium (Ti) oxide, polishing the low thermal expansion glass substrate using a polishing agent, thereby obtaining a polished glass substrate, treating the polished glass substrate using an aqueous solution containing hydrofluoric acid, thereby obtaining a treated glass substrate, cleaning the treated glass substrate using an acidic solution with a pH of 4 or less, thereby obtaining a cleaned glass substrate, and further cleaning the cleaned glass substrate using an alkaline solution.

The method may be arranged to another aspect in that the mask blank substrate is a glass substrate for a reflective mask blank.

According to still another aspect of the present invention, there is provided a reflective mask blank manufacturing method comprising forming, on the mask blank substrate manufactured by the method according to another aspect, a multilayer reflective film adapted to reflect exposure light and an absorbent film adapted to absorb the exposure light.

According to yet another aspect of the present invention, there is provided a mask blank substrate manufactured by polishing a $SiO_2$—$TiO_2$-based glass substrate so that a main surface thereof has a flatness of 0.05 μm or less and a surface roughness of 0.15 nm or less in Rms, wherein, among convex defects present on the main surface, the number of convex defects each having a titanium (Ti) content higher than an average titanium (Ti) content of the substrate and each having a size corresponding to 60 nm or more is 10 or less.

DESCRIPTION OF THE EMBODIMENTS

Hereinbelow, embodiments of this invention will be described in detail.

A mask blank substrate manufacturing method according to one embodiment of this invention is characterized in that a low thermal expansion glass substrate containing titanium (Ti) oxide is polished using a polishing agent, then treated using an aqueous solution containing hydrofluoric acid, then cleaned using an acidic solution with a pH of 4 or less, and then further cleaned using an alkaline solution.

A substrate to be used is a low thermal expansion glass substrate containing titanium (Ti) oxide. In the case of such a low thermal expansion glass substrate, there is a problem that if cleaning is carried out using the conventional cleaning method after polishing, convex defects are generated in large numbers on surfaces of the substrate. According to the study by the present inventors, this is a problem unique to a glass substrate containing Ti as a substrate component. According to the embodiment of this invention, it is possible to significantly reduce convex defects.

Figure 3:
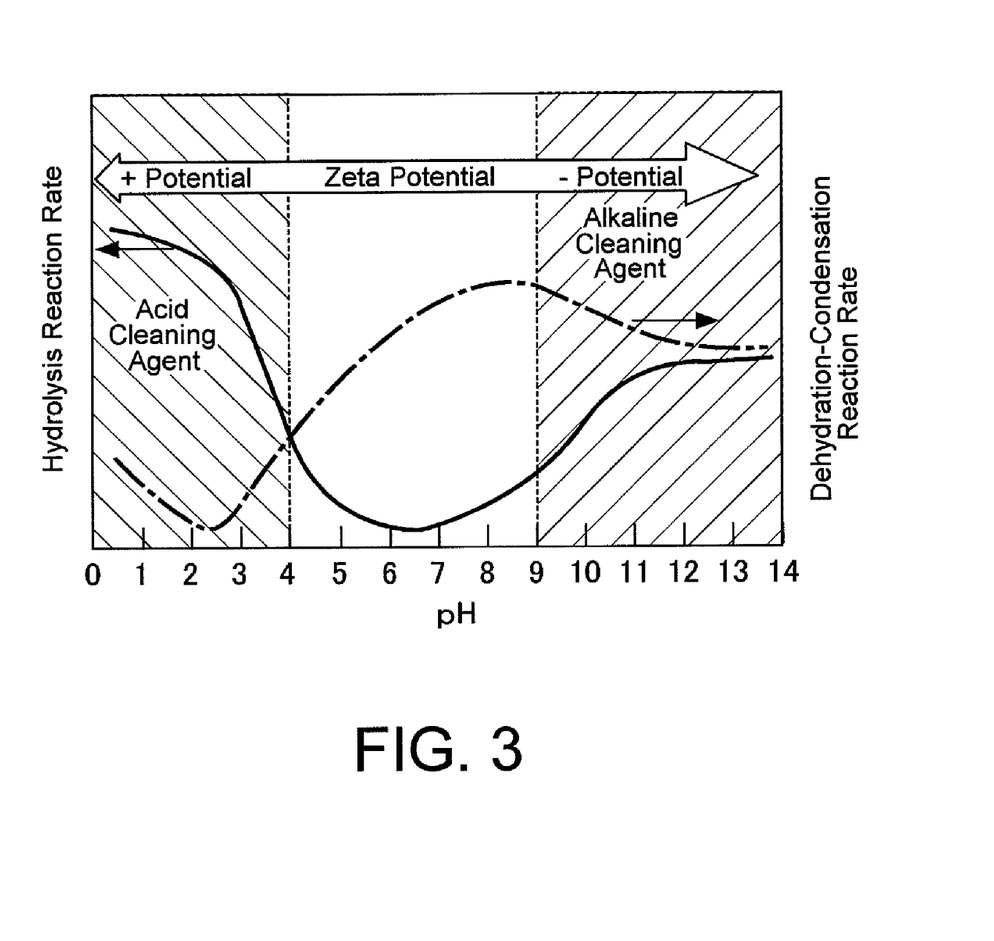
FIG. 3 is a diagram showing the tendency of the hydrolysis reaction rate, the dehydration-condensation reaction rate, and the change in zeta potential depending on the pH with respect to a $SiO_2$ sol.

As described before, the present inventors have obtained the knowledge that, in convex defects detected on a low thermal expansion glass substrate after cleaning, there are those convex defects generated by dissolution of the substrate itself. In a series of reaction processes for producing a $SiO_2$ sol from alkoxysilane by a sol-gel method, a hydrolysis reaction is first carried out and then a dehydration-condensation reaction is carried out. FIG. 3 is an image diagram showing the relationship among the hydrolysis reaction rate, the dehydration-condensation reaction rate, and the pH and further showing the change in zeta potential in the series of reaction processes for producing the $SiO_2$ sol.

According to FIG. 3, there is a tendency that the dehydration-condensation reaction rate increases in a region where the pH is neutral to alkaline. Conversely, there is a tendency that the hydrolysis reaction rate increases in an acidic region with a pH of 4 or less. Also in the case of a $TiO_2$ sol, approximately the same tendency is exhibited as that in the case of the $SiO_2$ sol.

If this is applied to the case of cleaning of a low thermal expansion glass substrate, in the region where the pH is neutral to alkaline, dehydration-condensation reactions of a $SiO_2$ sol and a $TiO_2$ sol being dissolved substrate components proceed so that the $SiO_2$ sol and the $TiO_2$ sol tend to be redeposited on surfaces of the substrate. Therefore, when the cleaning with an alkaline solution is carried out after etching of the substrate surfaces with hydrofluoric acid in the state where the dissolved substrate components are not fully removed from the substrate surfaces, the $SiO_2$ sol and the $TiO_2$ sol adhere to the substrate surfaces due to the dehydration-condensation reactions, thereby forming convex defects in a form involving a polishing slurry depending on a case. On the other hand, in the region with a pH of 4 or less, hydrolysis reactions of a $SiO_2$ sol and a $TiO_2$ sol being dissolved substrate components proceed so that it is possible to suppress readhesion thereof to surfaces of the substrate.

The reason that cleaning with an alkaline solution has conventionally been carried out after etching with hydrofluoric acid is that, by causing both the potential of a substrate surface and the zeta potential of a foreign substance to be negative by the alkaline solution, there is an effect of increasing the electrostatic repulsion between them to thereby suppress adhesion of the foreign substance to the substrate surface. In the case of a synthetic quartz substrate containing no titanium oxide, no $TiO_2$ sol exists and only a $SiO_2$ sol exists as a dissolved substrate component. In the case of the $SiO_2$ sol, since the electrostatic repulsion exceeds the dehydration-condensation reaction with respect to the substrate, redeposition thereof on the substrate does not substantially occur and thus hardly causes a problem. On the other hand, in the case of a low thermal expansion glass substrate containing titanium oxide, both a $SiO_2$ sol and a $TiO_2$ sol exist as dissolved substrate components. In the case of the $TiO_2$ sol, since the dehydration-condensation reaction exceeds the electrostatic repulsion with respect to the substrate, redeposition thereof on the substrate occurs and thus causes a problem.

As a result of the study based on this knowledge, the present inventors have come to think of substrate processing in which a substrate having been subjected to etching with hydrofluoric acid is first cleaned with an acidic solution having a pH of 4 or less to thereby remove dissolved substrate components ($SiO_2$ sol and $TiO_2$ sol) and then is cleaned with an alkaline solution to thereby cause the zeta potential of a substrate surface to have a negative potential tendency.

The above-mentioned substrate preferably has a low thermal expansion coefficient in a range of $0\pm1.0\times10^{-7}/°C$. and more preferably in a range of $0\pm0.3\times10^{-7}/°C$. for preventing pattern deformation due to heat in exposure so as to be suitable as a glass substrate for a reflective mask adapted to use EUV light as exposure light. As a material having the low thermal expansion coefficient in this range, in the case of, for example, an amorphous glass, use is preferably made of a $SiO_2$—$TiO_2$-based glass obtained by adding $TiO_2$ in a range of, for example, about 5 to 10 wt % to $SiO_2$.

Further, the above-mentioned substrate preferably has high smoothness and high flatness for obtaining high reflectance and high transfer accuracy so as to be suitable as a glass substrate for a reflective mask adapted to use EUV light as exposure light. Particularly, the substrate preferably has a surface with a smoothness of 0.150 nm Rms or less (smoothness in a 10 μm square area) and a flatness of 50 nm or less (flatness in a 142 mm square area). Further, the substrate preferably has high rigidity for preventing deformation thereof due to film stress of a film to be formed thereon. Particularly, the substrate preferably has a high Young's modulus of 65 GPa or more.

The unit Rms representing the smoothness is a root mean square roughness which can be measured by an atomic force microscope. The flatness is a value representing a warp (deformation amount) of a surface given by TIR (Total Indicated Reading) and, assuming that a plane determined by the method of least squares on the basis of a substrate surface is given as a focal plane, the flatness is an absolute value of a height difference between the highest position of the substrate surface located above the focal plane and the lowest position of the substrate surface located below the focal plane.

According to the mask blank substrate manufacturing method according to the embodiment of this invention, end faces of the above-mentioned low thermal expansion glass substrate containing titanium (Ti) oxide, machined to a predetermined size, are chamfered and polished and then main surfaces thereof are ground and polished to a predetermined surface roughness. As a main surface polishing method, it is preferable, for example, to press polishing surface plates, each bonded with a polishing pad, onto the main surfaces of the glass substrate and then to relatively move the polishing surface plates and the glass substrate while supplying a polishing liquid containing polishing abrasive grains, thereby polishing the main surfaces of the glass substrate.

As the polishing pad, use can be made of, for example, a suede-type super-soft polisher. As the polishing abrasive grains, use can be made of, for example, cerium oxide abrasive grains or silica-based abrasive grains such as silicic anhydride (fumed silica) abrasive grains, hydrated silica abrasive grains, or abrasive grains of colloidal silica obtained by an ion-exchange method or ultrahigh-purity colloidal silica obtained from alkoxysilane, according to the purpose such as rough polishing or precision polishing. When silica-based abrasive grains are used in polishing just before etching with a hydrofluoric acid aqueous solution, the substrate processing of this invention functions particularly effective.

The main surfaces of the substrate may be polished simultaneously or one by one.

The glass substrate having been subjected to the above-mentioned polishing is first treated with a hydrofluoric acid aqueous solution for removing the polishing abrasive grains and so on adhering to the glass substrate. In order to properly achieve an etching action on the surfaces of the glass substrate by hydrofluoric acid, the concentration of the hydrofluoric acid aqueous solution is preferably adjusted to a pH of about 3 to 4 (e.g. about 0.2 to 0.3 wt %). The treatment is carried out by immersing the glass substrate in a cleaning bath containing the hydrofluoric acid aqueous solution, preferably while applying an ultrasonic wave with a frequency on the order of MHz. More preferably, the treatment may be carried out by a method of spraying the hydrofluoric acid aqueous solution onto the surfaces of the glass substrate using a nozzle or nozzles or the like while spinning the glass substrate, and further preferably, the treatment may be carried out by a method which, in addition thereto, jointly uses an ultrasonic wave with a frequency on the order of MHz. The treatment time is, for example, about one minute in the case of the treatment by nozzle spraying jointly using the ultrasonic wave on the order of MHz.

A hydrofluosilic acid aqueous solution may be used instead of the hydrofluoric acid aqueous solution. Alternatively, use may be made of an aqueous solution containing hydrofluoric acid and hydrofluosilic acid.

Then, cleaning is carried out using an acidic solution with a pH of 4 or less. By performing the acid cleaning using the acidic solution with a pH of 4 or less after the treatment (etching) with hydrofluoric acid, it is possible to suppress the condensation reaction of dissolved substrate components generated by the etching with hydrofluoric acid, thereby removing the dissolved substrate components from the substrate surfaces. That is, the dissolved substrate components generated by the etching with hydrofluoric acid can be removed from the substrate surfaces before the occurrence of condensation reaction thereof and, as a result, it is possible to suppress the generation of convex defects on the substrate surfaces. The reason for setting the pH to 4 or less is that, as described before, there is a tendency that the hydrolysis reaction rate increases in that acidic region and thus it is possible to suppress readhesion of a $SiO_2$ sol and a $TiO_2$ sol being the dissolved substrate components to the substrate surfaces. If the pH is set to 3 or less, the hydrolysis reaction rate further increases so that the action by the acid cleaning can be obtained more easily. Further, if the pH is set to 2 or less, the hydrolysis reaction rate becomes substantially maximum so that it is possible to maximally suppress readhesion of the dissolved substrate components to the substrate surfaces.

The acidic solution is not particularly limited as long as the pH is 4 or less, but the acidic solution preferably contains substantially no hydrofluoric acid that dissolves the low thermal expansion glass substrate and, further, the acidic solution preferably contains, for example, one of hydrochloric acid, phosphoric acid, and oxalic acid. The concentration of the acidic solution may be properly adjusted in the range of a pH of 4 or less.

As a method for the acid cleaning, the treatment is carried out by immersing the glass substrate in a cleaning bath containing the acidic solution, preferably while applying an ultrasonic wave with a frequency on the order of MHz. More preferably, the treatment may be carried out by a method of spraying the acidic solution onto the surfaces of the glass substrate using nozzles or the like while spinning the glass substrate, or the treatment may be carried out by a method which, in addition thereto, jointly uses an ultrasonic wave with a frequency on the order of MHz. The treatment time is, for example, about one minute in the case of the treatment by nozzle spraying jointly using the ultrasonic wave on the order of MHz.

Then, cleaning is carried out using an alkaline solution. After the above-mentioned acid cleaning, it is preferable to finally carry out the alkaline cleaning for increasing the electrostatic repulsion between the substrate surfaces and a polishing slurry (e.g. a silica slurry) existing therearound. For this purpose, the alkaline solution preferably has a pH of, for example, 9 or more. As an alkaline component, use can be made of, for example, NaOH, KOH, $NH_4OH$, or TMAH.

As a method for the alkaline cleaning, the treatment is carried out by immersing the glass substrate in a cleaning bath containing the alkaline solution, preferably while applying an ultrasonic wave with a frequency on the order of MHz. More preferably, the treatment may be carried out by a method of spraying the alkaline solution onto the surfaces of the glass substrate using nozzles or the like while spinning the glass substrate, or the treatment may be carried out by a method which, in addition thereto, jointly uses an ultrasonic wave with a frequency on the order of MHz. The treatment time is, for example, about one minute in the case of the treatment by nozzle spraying jointly using the ultrasonic wave on the order of MHz. Then, finally, washing with pure water (rinsing) is properly carried out and then spin drying or drying with IPA (isopropyl alcohol) or the like is carried out.

As described above, by performing the acid cleaning, i.e. the cleaning using the acidic solution with a pH of 4 or less, after the treatment (etching) with hydrofluoric acid, the dissolved substrate components generated by the etching with hydrofluoric acid can be removed from the substrate surfaces before the occurrence of condensation reaction thereof and thus it is possible to suppress the generation of convex defects on the substrate surfaces. Therefore, the number of convex defects can be largely reduced so that it is possible to obtain a mask blank substrate suitable as a reflective mask blank substrate required to have defect quality of very high level.

It is also possible to provide a method of manufacturing a reflective mask blank by forming, on the mask blank substrate manufactured by the above-mentioned manufacturing method, a multilayer reflective film adapted to reflect exposure light and an absorbent film adapted to absorb the exposure light.

The obtained mask blank substrate is particularly suitable as a reflective mask blank substrate.

Further, a manufacturing method according to another embodiment of this invention can provide a mask blank substrate manufactured by polishing a $SiO_2$—$TiO_2$-based glass substrate with a thermal expansion coefficient in a range of $0 \pm 1.0 \times 10^{-7}/°$ C. so that a main surface thereof has a flatness of 0.05 μm or less and a surface roughness of 0.15 nm or less in Rms, wherein, among convex defects present on the main surface of the substrate, the number of convex defects each having a titanium content higher than the average titanium content of the substrate and each having a size corresponding to 60 nm or more is 10 or less. The convex defect having the size corresponding to 60 nm or more referred to herein represents a convex defect detectable by a defect inspection apparatus with a 60 nm sensitivity or higher. Further, the defect inspection apparatus with the 60 nm sensitivity represents a defect inspection apparatus that can detect polystyrene latex (PSL) particles (PSL particles have properties such that the probability of the particles to approach each other within 1 mm is 1% or less) having a particle size of 60 nm even when a defect inspection is conducted for a specimen in which those PSL particles are scattered on a substrate.

Figure 1:
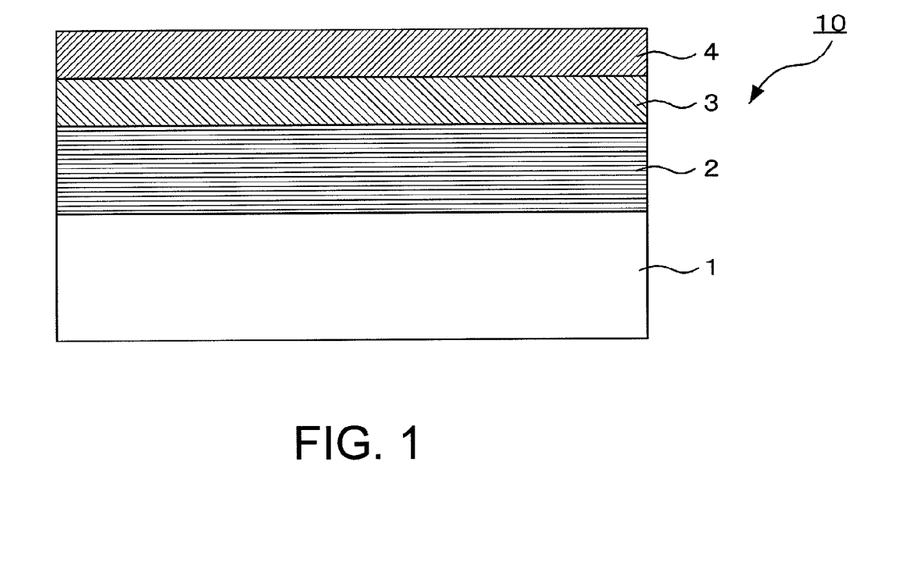
FIG. 1 is a sectional view of a reflective mask blank manufactured by a manufacturing method according to an embodiment of this invention.

FIG. 1 is a schematic sectional view showing one example of obtained reflective mask blanks.

As shown in FIG. 1, a reflective mask blank 10 has a structure in which a multilayer reflective film 2 is formed on a substrate 1, a buffer film 3 is formed on the multilayer reflective film 2, and an absorbent film 4 is formed on the buffer film 3.

Herein, the substrate 1 is a mask blank substrate obtained by the manufacturing method according to the embodiment of this invention and, as described above, is preferably a $SiO_2$—$TiO_2$-based low thermal expansion glass substrate.

The multilayer reflective film 2 is a multilayer film in which elements with different refractive indices are periodically laminated and, in general, use is made of a multilayer film in which thin films of a heavy element or its compound and thin films of a light element or its compound are alternately laminated by about 40 to 60 cycles.

For example, as a multilayer reflective film for EUV light having a wavelength of 13 to 14 nm, use is preferably made of a Mo/Si cycle multilayer film in which Mo films and Si films are alternately laminated by about 40 cycles. As other multilayer reflective films for use in the region of the EUV light, there are a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, and so on. The material may be properly selected according to the exposure wavelength.

The multilayer reflective film 2 can be formed by depositing each layer by DC magnetron sputtering, ion beam sputtering, or the like. In the case of the above-mentioned Mo/Si cycle multilayer film, using, for example, the ion beam sputtering, a Si target is first used to form a Si film having a thickness of about several nm, then a Mo target is used to form a Mo film having a thickness of about several nm and, given that this forms one cycle, Si and Mo films are laminated by 40 to 60 cycles and, finally, a Si film is formed.

The buffer film 3 having etching characteristics different from those of the absorbent film 4 may be formed between the multilayer reflective film 2 and the absorbent film 4. By forming such a buffer film 3, the multilayer reflective film 2 is prevented from being damaged due to etching during pattern formation and pattern correction of the absorbent film 4. Particularly, if the buffer film 3 is made of a chromium-based material containing chromium, it can obtain high smoothness and therefore a surface of the absorbent film 4 formed thereon can also obtain high smoothness so that pattern blur can be reduced.

As a material of the chromium-based buffer film 3, use can be made of chromium (Cr) alone or a material containing chromium (Cr) and at least one kind of element selected from nitrogen (N), oxygen (O), carbon (C), and fluorine (F). For example, the smoothness becomes excellent by containing nitrogen, the etching resistance under the dry etching conditions of the absorbent film 4 is improved by containing carbon, and the film stress can be reduced by containing oxygen. Specifically, it is preferable to use a material such as CrN, CrO, CrC, CrF, CrON, CrCO, or CrCON. The buffer film 3 can be formed by sputtering such as DC sputtering, RF sputtering, or ion beam sputtering.

When performing correction of an absorbent film pattern using, for example, a focused ion beam (FIB), the thickness of the buffer film 3 is preferably set to about 20 to 60 nm, but, when the FIB is not used, it may be set to about 5 to 15 nm.

The buffer film 3 may be made of a material such as Ru, RuNb, or RuZr. Since the transmittance of each of these materials for EUV light is high, the high reflectance is obtained even if etching for forming the same pattern as that of the absorbent film 4 is not carried out. In this case, the thickness of the buffer film 3 is preferably set to about 0.8 to 5 nm.

The absorbent film 4 has a function of absorbing exposure light, for example, EUV light and can be preferably made of, for example, tantalum (Ta) alone or a material mainly composed of Ta. The material mainly composed of Ta is normally an alloy of Ta. In terms of smoothness and flatness, the absorbent film preferably has an amorphous or crystallite structure.

As the material mainly composed of Ta, use can be made of a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, or the like. By adding B, Si, Ge, or the like to Ta, the amorphous material can be easily obtained to improve the smoothness. On the other hand, by adding N or O to Ta, the resistance to oxidation is improved and therefore there is obtained an effect of improving the aging stability.

As the particularly preferable material among them, use can be made of, for example, the material containing Ta and B (composition ratio Ta/B is in a range of 8.5/1.5 to 7.5/2.5) or the material containing Ta, B, and N (when N is 5 to 30 at % and the balance is given as 100, B is 10 to 30 at %). In the case of such a material, the crystallite or amorphous structure can be easily obtained so that excellent smoothness and flatness can be achieved.

Such an absorbent film composed of Ta alone or mainly composed of Ta is preferably formed by sputtering such as magnetron sputtering. For example, in the case of the TaBN film, it can be formed by sputtering using a target containing tantalum and boron and using an argon gas added with nitrogen.

Other than the material mainly composed of Ta, use can be made of, for example, a material such as WN, TiN, or Ti as the absorbent film 4. The thickness of the absorbent film 4 is required to be set to a value that can sufficiently absorb exposure light, for example, EUV light and is normally set to about 30 to 100 nm. The absorbent film 4 may have a laminated structure composed of a plurality of layers of different materials and compositions.

Even in the case of a reflective mask using EUV light as exposure light, light having a wavelength of 193 nm, 257 nm, or the like longer than that of the EUV light is often used as inspection light in a pattern inspection. For adaptation to the long-wavelength inspection light, it is necessary to reduce the surface reflection of the absorbent film. In this case, the absorbent film preferably has a structure in which an absorbent layer having a function of mainly absorbing the EUV light and a low reflective layer having a function of mainly reducing the surface reflection for the inspection light are laminated in this order from the substrate side. When the absorbent layer is made of a material mainly composed of Ta, the low reflective layer is preferably made of a material containing Ta or TaB and further containing O.

Each of the above-mentioned reflective mask blanks may be in a state of being formed with a resist film to be used for forming the absorbent film into a predetermined transfer pattern.

As reflective masks obtained using the above-mentioned reflective mask blanks, the following modes are cited.

(1) A reflective mask having a buffer film formed on a multilayer reflective film formed on a substrate and having an absorbent film pattern in the form of a predetermined transfer pattern formed on the buffer film.

(2) A reflective mask having a buffer film pattern and an absorbent film pattern each in the form of a predetermined transfer pattern formed on a multilayer reflective film formed on a substrate.

(3) A reflective mask having an absorbent film pattern in the form of a predetermined transfer pattern formed on a multilayer reflective film formed on a substrate (in the case of having no buffer film).

Hereinbelow, the embodiments of this invention will be described in further detail in terms of various Examples.

Example 1

Use was made of a $SiO_2$—$TiO_2$-based glass substrate (6-inch square; thickness: 6.35 mm). This glass substrate had a thermal expansion coefficient of $0.2 \times 10^{-7}$/° C. and a Young's modulus of 67 GPa.

Then, end faces of the glass substrate were chamfered and polished and then main surfaces thereof were ground and subjected to rough polishing using a polishing liquid containing cerium oxide abrasive grains. Then, the glass substrate was set on a carrier of a double-side polishing machine and subjected to precise polishing under predetermined polishing conditions using as a polishing liquid an alkaline aqueous solution containing colloidal silica abrasive grains.

After the precise polishing, a dilute hydrofluoric acid aqueous solution (hydrofluoric acid concentration: 0.2 wt %) was sprayed onto the glass substrate using nozzles while applying an ultrasonic wave on the order of MHz, thereby carrying out etching for about one minute.

Then, a hydrochloric acid aqueous solution adjusted to pH 2 was sprayed onto the glass substrate using nozzles while applying an ultrasonic wave on the order of MHz, thereby carrying out acid cleaning for about one minute.

Then, an ammonia aqueous solution adjusted to pH 9.3 was sprayed onto the glass substrate using nozzles while applying an ultrasonic wave on the order of MHz, thereby carrying out alkaline cleaning for about one minute.

Finally, the glass substrate was washed with pure water and then spin-dried.

In the manner described above, 10 EUV reflective mask blank glass substrates were produced.

The surface roughness of the main surfaces of all the glass substrates thus obtained was as good as 0.150 nm or less in root mean square roughness (RMS). Further, all the glass substrates were formed to a flatness of 50 nm or less.

Figure 2:
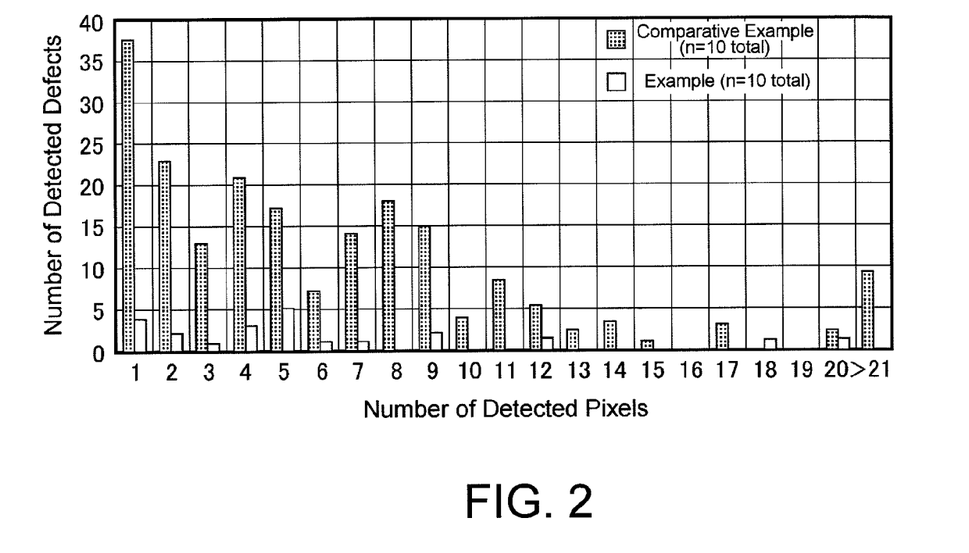
FIG. 2 is a graph showing the relationship between the detected defect size (pixels) and the number of detected defects in Example 1 and Comparative Example.

Then, each of the main surfaces of the obtained 10 glass substrates was examined using a laser interference confocal optical system defect inspection apparatus (M1350 manufactured by Lasertec Corporation), thereby attempting to discover a convex defect of 5 pixels or more (5 pixels correspond to a size of a convex defect of 60 nm). As a result, the number of discovered convex defects was 2.2 on average per glass substrate (The maximum number of convex defects discovered on one glass substrate was 5. Among them, the number of convex defects each having a titanium content higher than the average titanium content of the glass substrate was 2.). Based on the inspection results, distribution was derived per defect size per glass substrate and the total number of detected convex defects of the 10 glass substrates was derived per defect size. FIG. 2 is a graph showing the derived total numbers for the respective defect sizes. In FIG. 2, the abscissa axis represents the defect size in terms of the number of detected pixels. The larger number of detected pixels represents a larger-size defect, while, the smaller number of detected pixels represents a smaller-size defect.

Comparative Example

As Comparative Example for the Example 1, 10 EUV reflective mask blank glass substrates were produced in the same manner as in the Example 1 except that the alkaline cleaning was carried out without performing the acid cleaning after performing the hydrofluoric acid treatment.

The surface roughness of the main surfaces of all the glass substrates thus obtained was as good as 0.150 nm or less in root mean square roughness (RMS). Further, all the glass substrates were formed to a flatness of 50 nm or less.

Then, the main surfaces of the obtained 10 glass substrates were examined using the above-mentioned defect inspection apparatus, thereby attempting to discover a convex defect of 5 pixels or more. As a result, the number of discovered convex defects was 20.4 on average per glass substrate and thus the convex defects were generated in large numbers. Based on the inspection results, distribution was derived per defect size per glass substrate and the total number of detected convex defects of the 10 glass substrates was derived per defect size. FIG. 2 shows the derived total numbers for the respective defect sizes.

From the results of FIG. 2, it is clear that, as compared with the Comparative Example (conventional cleaning method) in which the glass substrates after the polishing were not subjected to the acid cleaning after the hydrofluoric acid treatment, the overall number of convex defects was significantly reduced and further the number of convex defects was significantly reduced for any defect size in the Example 1 in which the acid cleaning was carried out after the hydrofluoric acid treatment. That is, according to the Example 1, the number of convex defects is significantly reduced so that it is possible to obtain a mask blank substrate suitable as a reflective mask blank substrate required to have defect quality of very high level.

Examples 2 and 3

10 EUV reflective mask blank glass substrates were produced in each of Examples 2 and 3 in the same manner as in the Example 1 except that a hydrochloric acid aqueous solution adjusted to pH 3 (Example 2) or pH 4 (Example 3) was used in the acid cleaning after the hydrofluoric acid treatment.

The surface roughness of the main surfaces of all the glass substrates thus obtained was as good as 0.150 nm or less in root mean square roughness (RMS). Further, all the glass substrates were formed to a flatness of 50 nm or less.

Then, the main surfaces of the obtained 10 glass substrates in each of the Examples 2 and 3 were examined using the above-mentioned defect inspection apparatus, thereby attempting to discover a convex defect of 5 pixels or more. As a result, in the Example 2, the number of discovered convex defects was 2.8 on average per glass substrate (The maximum number of convex defects discovered on one glass substrate was 6. Among them, the number of convex defects each having a titanium content higher than the average titanium content of the glass substrate was 4.) and, in the Example 3, the number of discovered convex defects was 3.4 on average per glass substrate (The maximum number of convex defects discovered on one glass substrate was 7. Among them, the number of convex defects each having a titanium content higher than the average titanium content of the glass substrate was 5.). Thus, the excellent results were obtained.

Examples 4 to 6

10 EUV reflective mask blank glass substrates were produced in each of Examples 4 to 6 in the same manner as in the Example 1 except that, instead of the hydrochloric acid aqueous solution used in the acid cleaning after the hydrofluoric acid treatment, use was made of a phosphoric acid aqueous solution adjusted to pH 2 (Example 4), pH 3 (Example 5), or pH 4 (Example 6).

The surface roughness of the main surfaces of all the glass substrates thus obtained was as good as 0.150 nm or less in root mean square roughness (RMS). Further, all the glass substrates were formed to a flatness of 50 nm or less.

Then, the main surfaces of the obtained 10 glass substrates in each of the Examples 4 to 6 were examined using the above-mentioned defect inspection apparatus, thereby attempting to discover a convex defect of 5 pixels or more. As a result, in the Example 4, the number of discovered convex defects was 2.4 on average per glass substrate (The maximum number of convex defects discovered on one glass substrate was 5. Among them, the number of convex defects each having a titanium content higher than the average titanium content of the glass substrate was 3.), in the Example 5, the number of discovered convex defects was 3.0 on average per glass substrate (The maximum number of convex defects discovered on one glass substrate was 7. Among them, the number of convex defects each having a titanium content higher than the average titanium content of the glass substrate was 6.), and in the Example 6, the number of discovered convex defects was 3.6 on average per glass substrate (The maximum number of convex defects discovered on one glass substrate was 9. Among them, the number of convex defects each having a titanium content higher than the average titanium content of the glass substrate was 8.). Thus, the excellent results were obtained.

Examples 7 to 9

10 EUV reflective mask blank glass substrates were produced in each of Examples 7 to 9 in the same manner as in the Example 1 except that, instead of the hydrochloric acid aqueous solution used in the acid cleaning after the hydrofluoric acid treatment, use was made of an oxalic acid aqueous solution adjusted to pH 2 (Example 7), pH 3 (Example 8), or pH 4 (Example 9).

The surface roughness of the main surfaces of all the glass substrates thus obtained was as good as 0.150 nm or less in root mean square roughness (RMS). Further, all the glass substrates were formed to a flatness of 50 nm or less.

Then, the main surfaces of the obtained 10 glass substrates in each of the Examples 7 to 9 were examined using the above-mentioned defect inspection apparatus, thereby attempting to discover a convex defect of 5 pixels or more. As a result, in the Example 7, the number of discovered convex defects was 2.5 on average per glass substrate (The maximum number of convex defects discovered on one glass substrate was 5. Among them, the number of convex defects each having a titanium content higher than the average titanium content of the glass substrate was 3.), in the Example 8, the number of discovered convex defects was 3.1 on average per glass substrate (The maximum number of convex defects discovered on one glass substrate was 8. Among them, the number of convex defects each having a titanium content higher than the average titanium content of the glass substrate was 6.), and in the Example 9, the number of discovered convex defects was 3.9 on average per glass substrate (the maximum number of convex defects discovered on one glass substrate was 10. Among them, the number of convex defects each having a titanium content higher than the average titanium content of the glass substrate was 10). Thus, the excellent results were obtained.

Example 10

A multilayer reflective film was formed on the mask blank glass substrate obtained in the Example 1. As the multilayer reflective film formed on the substrate, a Mo film/Si film cycle multilayer reflective film was employed so as to obtain the multilayer reflective film suitable for an exposure light wavelength band of 13 to 14 nm. That is, the multilayer reflective film was formed using a Mo target and a Si target and alternately laminating Mo films and Si films on the substrate by ion beam sputtering. First, a Si film was deposited to a thickness of 4.2 nm using the Si target, then a Mo film was deposited to a thickness of 2.8 nm using the Mo target and, given that this formed one cycle, films were laminated by 40 cycles and then a Si film was deposited to a thickness of 4.2 nm.

In this manner, a multilayer reflective film coated substrate was obtained. Reflectance was measured by applying EUV light of 13.5 nm to the multilayer reflective film at an incident angle of 6.0 degrees and it was 65.9%.

Then, a buffer film was formed on the multilayer reflective film coated substrate. As the buffer film, a chromium nitride film was deposited to a thickness of 20 nm. The buffer film was formed by DC magnetron sputtering using a Cr target and using a mixed gas of argon (Ar) and nitrogen ($N_2$) as a sputtering gas. In the formed CrNx film, nitrogen (N) was 10 at % (x=0.1).

Then, on the buffer film, a material containing Ta, B, and N was deposited to a thickness of 80 nm as an absorbent film. That is, the absorbent film was formed by DC magnetron sputtering using a target containing Ta and B and adding nitrogen ($N_2$) in an amount of 10% to argon (Ar), thereby obtaining a reflective mask blank of this Example. The composition ratio of the formed TaBN film was such that Ta was 80 at %, B was 10 at %, and N was 10 at %.

Then, using this reflective mask blank, an EUV exposure reflective mask having a pattern of the semiconductor design rule DRAM hp45 nm generation was fabricated in the following manner.

First, an electron-beam writing resist film was coated on the reflective mask blank, then predetermined pattern writing was carried out using an electron-beam writing apparatus, and then development was carried out after the pattern writing, thereby forming a resist pattern.

Then, using this resist pattern as a mask, dry etching was applied to the absorbent film with the use of a chlorine gas, thereby forming the absorbent film into a transfer pattern.

Then, using the absorbent film pattern as a mask, dry etching was applied to the buffer film with the use of a mixed gas of chlorine and oxygen to remove the buffer film remaining in a reflection area (portion with no absorbent film pattern), thereby exposing the multilayer reflective film to obtain a reflective mask.

A final confirmation inspection of the obtained reflective mask was carried out and it was confirmed that the pattern of the semiconductor design rule DRAM hp45 nm generation was formed according to a design.

Then, using the obtained reflective mask of this Example, pattern transfer onto a semiconductor substrate was carried out with the use of EUV light and it was confirmed that the reflective mask of this Example satisfied the accuracy required for the semiconductor design rule DRAM hp45 nm generation.

Herein, the structures of various embodiments of this invention will be enumerated.

(Structure 1). A method of manufacturing a mask blank substrate, wherein a low thermal expansion glass substrate containing titanium (Ti) oxide is polished using a polishing agent, then treated using an aqueous solution containing hydrofluoric acid, then cleaned using an acidic solution with a pH of 4 or less, and then further cleaned using an alkaline solution.

(Structure 2) The method according to the structure 1, wherein the acidic solution contains substantially no hydrofluoric acid.

(Structure 3) The method according to claim 1, wherein the acidic solution contains one of hydrochloric acid, phosphoric acid, and oxalic acid.

(Structure 4) The method according to claim 1, wherein the alkaline solution has a pH of 9 or more.

(Structure 5) The method according to claim 1, wherein the low thermal expansion glass substrate is a $SiO_2$—$TiO_2$-based glass substrate having a thermal expansion coefficient in a range of $0 \pm 1.0 \times 10^{-7}$/° C.

(Structure 6) The method according to claim 1, wherein the mask blank substrate is a glass substrate for a reflective mask blank.

(Structure 7) A reflective mask blank manufacturing method comprising forming, on the mask blank substrate manufactured by the method according to claim 6, a multilayer reflective film adapted to reflect exposure light and an absorbent film adapted to absorb the exposure light.

(Structure 8) A mask blank substrate manufactured by polishing a $SiO_2$—$TiO_2$-based glass substrate so that a main surface thereof has a flatness of 0.05 µm or less and a surface roughness of 0.15 nm or less in Rms, wherein, among convex defects present on the main surface, the number of convex defects each having a titanium (Ti) content higher than an average titanium (Ti) content of the substrate and each having a size corresponding to 60 nm or more is 10 or less.

(Structure 9) The mask blank substrate according to claim 8, wherein the $SiO_2$—$TiO_2$-based glass substrate has a thermal expansion coefficient in a range of $0\pm1.0\times10^{-7}/°$ C.

According to the above-mentioned Structure 1, by performing the acid cleaning, i.e. the cleaning using the acidic solution with a pH of 4 or less, after the treatment (etching) with hydrofluoric acid, it is possible to suppress the condensation reaction of the dissolved substrate components particularly the titanium component, thereby removing the dissolved substrate components from the substrate surfaces. That is, the dissolved substrate components generated by the etching with hydrofluoric acid can be removed from the substrate surfaces before the occurrence of condensation reaction thereof and, as a result, it is possible to suppress the generation of convex defects on the substrate surfaces. Then, the alkaline cleaning is finally carried out for increasing the electrostatic repulsion between the substrate surfaces and the polishing slurry (silica slurry) existing therearound.

The aqueous solution containing hydrofluoric acid may alternatively be an aqueous solution containing hydrofluosilic acid or an aqueous solution containing a fluorine compound such as sodium fluoride or ammonium fluoride that produces hydrofluoric acid when dissolved in water.

As the acidic solution, use can be made of any of various acidic solutions such as hydrochloric acid, phosphoric acid, oxalic acid, nitric acid, sulfuric acid, citric acid, acetic acid, and formic acid as long as the pH is 4 or less. However, as recited in the Structure 2, the acidic solution preferably contains substantially no hydrofluoric acid that dissolves the low thermal expansion glass substrate and, further, as recited in the Structure 3, the acidic solution preferably contains one of hydrochloric acid, phosphoric acid, and oxalic acid. As recited in the Structure 4, the alkaline solution preferably has a pH of 9 or more.

According to the Structures 1 to 9, when manufacturing a mask blank substrate from a low thermal expansion glass containing particularly titanium oxide, firstly, it is possible to provide a method of manufacturing a high-quality mask blank substrate in which the number of convex defects is reduced to satisfy the requirement for high-level defect quality. Secondly, it is possible to provide a method of manufacturing a mask blank substrate suitable as a reflective mask blank substrate required to have defect quality of very high level. Thirdly, it is possible to provide a method of manufacturing a reflective mask blank with an extremely small number of convex defects using such a mask blank substrate.

What is claimed is:

1. A method of manufacturing a mask blank substrate, comprising:
    preparing a low thermal expansion glass substrate containing titanium (Ti) oxide;
    polishing said low thermal expansion glass substrate using a polishing agent, thereby obtaining a polished glass substrate;
    treating said polished glass substrate using an aqueous solution containing hydrofluoric acid, thereby obtaining a treated glass substrate;
    cleaning said treated glass substrate using an acidic solution with a pH of 4 or less, thereby obtaining a cleaned glass substrate, the acidic solution containing no hydrofluoric acid; and
    further cleaning said cleaned glass substrate using an alkaline solution.

2. The method according to claim 1, wherein said acidic solution contains one of hydrochloric acid, phosphoric acid, and oxalic acid.

3. The method according to claim 1, wherein said alkaline solution has a pH of 9 or more.

4. The method according to claim 1, wherein said low thermal expansion glass substrate is a $SiO_2$—$TiO_2$-based glass substrate having a thermal expansion coefficient in a range of $0\pm1.0\times10^{-7}/°$ C.

5. The method according to claim 1, wherein said mask blank substrate is a glass substrate for a reflective mask blank.

6. A reflective mask blank manufacturing method comprising forming, on the mask blank substrate manufactured by the method according to claim 5, a multilayer reflective film adapted to reflect exposure light and an absorbent film adapted to absorb the exposure light.

7. The method according to claim 1, wherein the polishing agent comprises colloidal silica abrasive grains and is used as a polishing liquid comprising an alkaline aqueous solution containing said colloidal silica abrasive grains.

8. The method according to claim 1, wherein the cleaning step comprises spraying the acidic solution to the low thermal expansion glass substrate through nozzles while spinning the low thermal expansion glass substrate.

9. The method according to claim 1, wherein the cleaning step comprises applying an ultrasonic wave with a frequency on the order of MHz to said acidic solution.

* * * * *